US008713768B2

(12) United States Patent
Watanabe et al.

(10) Patent No.: US 8,713,768 B2
(45) Date of Patent: May 6, 2014

(54) METHOD OF PRODUCING PIEZOELECTRIC ACTUATOR

(75) Inventors: Yasuhiro Watanabe, Kanagawa (JP); Osamu Machida, Kanagawa (JP); Akira Shimofuku, Kanagawa (JP); Ryoh Tashiro, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 27 days.

(21) Appl. No.: 13/416,055

(22) Filed: Mar. 9, 2012

(65) Prior Publication Data

US 2012/0236084 A1 Sep. 20, 2012

(30) Foreign Application Priority Data

Mar. 16, 2011 (JP) ................. 2011-058254

(51) Int. Cl.
*B41J 2/045* (2006.01)
*H01L 41/22* (2013.01)

(52) U.S. Cl.
USPC ............ 29/25.35; 29/846; 310/324; 310/348; 310/365; 427/100

(58) Field of Classification Search
USPC .............. 29/25.35, 830, 846, 890.1; 310/324, 310/348, 365, 367; 427/100
See application file for complete search history.

(56) References Cited

U.S. PATENT DOCUMENTS 6,001,416 A * 12/1999 Moriyama et al. ............ 427/100
6,333,066 B1 * 12/2001 Kim .......................... 427/100 X
6,841,192 B2 * 1/2005 Hashimoto et al. ........... 427/100

FOREIGN PATENT DOCUMENTS

| JP | 02007479 A | * | 1/1990 | ............... 29/25.35 X |
| JP | 06131912 A | * | 5/1994 | |
| JP | 2000-85124 | | 3/2000 | |
| JP | 2000-246888 | | 9/2000 | |
| JP | 2001-113710 | | 4/2001 | |
| JP | 2001-121711 | | 5/2001 | |
| JP | 2004-6645 | | 1/2004 | |
| JP | 2010-3971 | | 1/2010 | |
| JP | 2011-18836 | | 1/2011 | |

OTHER PUBLICATIONS

Machine Language Translation (English) of Japanese Patent Publication, JP 2000-085124, Oct. 2013.*

* cited by examiner

*Primary Examiner* — A. Dexter Tugbang
(74) *Attorney, Agent, or Firm* — Cooper & Dunham LLP

(57) ABSTRACT

A method of producing a piezoelectric actuator includes a first electrode film forming process; a monomolecular film forming process; a pattering process of removing a monomolecular film having a rectangular shape; an application process of applying a precursor solution to the first electrode film exposed in the rectangular shape; a piezoelectric film forming process of converting the applied precursor solution into a piezoelectric film; and a second electrode film forming process. Materials of the precursor solution, the first electrode film, and the monomolecular film are adjusted so that the first electrode film is lyophilic and the monomolecular film is lyophobic to the precursor solution. The piezoelectric film forming process includes a drying and thermally decomposing process of drying and thermally decomposing the precursor solution; and a crystallizing process of crystallizing a thermally decomposed piezoelectric material.

5 Claims, 16 Drawing Sheets

US 8,713,768 B2

METHOD OF PRODUCING PIEZOELECTRIC ACTUATOR

BACKGROUND OF THE INVENTION

1. Field of the Invention

Embodiments of the present invention relate to a piezoelectric actuator, a method of producing the piezoelectric actuator, a liquid discharge head including the piezoelectric actuator, and an inkjet printer including the liquid discharge head.

2. Description of the Related Art

In a liquid discharge head which is utilized in an inkjet printer, a piezoelectric actuator causes an oscillation plate forming a wall surface of a compression chamber to deform, so as to apply pressure to ink inside the compression chamber. Then the ink inside the compression chamber is discharged through a nozzle communicating with the compression chamber, and the ink is adhered to a recording medium.

In general, a piezoelectric actuator having an oscillation plate as a substrate has a configuration such that both surfaces of a piezoelectric film are sandwiched and held between two corresponding electrode films. As a piezoelectric material forming the piezoelectric film, for example, lead zirconate titanate (PZT) ceramics has been utilized. Since lead zirconate titanate ceramics includes metal oxide as a main component, in general, it is called "metal composite oxide."

As a method of producing a piezoelectric actuator, various methods have been conventionally proposed. The applicant of the present application has previously proposed "a method of producing individual electrodes including a step for defining areas for forming plural piezoelectric elements by arranging wall surfaces having at least one communication groove on a substrate; a step for forming a common electrode by applying a common electrode material precursor solution to the areas for forming the piezoelectric elements and the communication groove by an inkjet method, and by baking the applied common electrode material precursor solution; a step for forming a piezoelectric material layer by applying a piezoelectric sol-gel solution to the areas for forming the piezoelectric elements by the inkjet method, and by baking the applied piezoelectric sol-gel solution; and a step for forming the individual electrodes by applying an individual electrode material precursor solution to the areas for forming the piezoelectric elements by the inkjet method, and by baking the applied individual electrode material precursor solution" (cf. Patent Document 1 (Japanese Published Unexamined Application No. 2011-018836)).

An objective of the embodiments is to provide a novel piezoelectric actuator producing method that eliminates "the step of forming the wall surfaces having the communication groove" included in the producing method disclosed in Patent Document 1, and that makes it easier to produce a piezoelectric actuator. Further, another objective of the embodiments is to realize a piezoelectric actuator produced by the above producing method, a liquid discharge head including the piezoelectric actuator, and an inkjet printer including the liquid discharge head.

SUMMARY OF THE INVENTION

In one aspect, there is provided a method of producing a piezoelectric actuator, the piezoelectric actuator including a first electrode and a second electrode that sandwich a piezoelectric film having a rectangular shape, the piezoelectric film being deformed by applying an electric voltage through the first electrode and the second electrode, the method including a first electrode film forming process of forming a first electrode film on a substrate on which the piezoelectric actuator is to be formed, wherein the first electrode film is to be the first electrode; a monomolecular film forming process of forming a monomolecular film at a desired area on the first electrode film by causing molecules to be self-assembled; a patterning process of patterning the monomolecular film to remove a portion of the monomolecular film having the rectangular shape of the piezoelectric film and exposing a portion of the first electrode film having the rectangular shape; an application process of applying a precursor solution of a piezoelectric material to the portion of the first electrode film exposed in the rectangular shape, wherein the precursor solution of the piezoelectric material is to be the piezoelectric film; a piezoelectric film forming process of converting the applied precursor solution into the piezoelectric film; and a second electrode film forming process of forming a second electrode film on the formed piezoelectric film, wherein the second electrode film is to be a second electrode. A material of the precursor solution, a material of the first electrode film, and a material of the monomolecular film are adjusted so that the first electrode film is lyophilic with respect to the precursor solution of the piezoelectric material and the monomolecular film is lyophobic with respect to the precursor solution of the piezoelectric material. The piezoelectric film forming process includes a drying and thermally decomposing process of drying and thermally decomposing the applied precursor solution; and a crystallizing process of crystallizing the thermally decomposed piezoelectric material.

In another aspect, there is provided a piezoelectric actuator formed on a substrate by a method, the piezoelectric actuator including a first electrode and a second electrode that sandwich a piezoelectric film having a rectangular shape, the piezoelectric film being deformed by applying an electric voltage through the first electrode and the second electrode, the method including a first electrode film forming process of forming a first electrode film on the substrate on which the piezoelectric actuator is to be formed, wherein the first electrode film is to be the first electrode; a monomolecular film forming process of forming a monomolecular film at a desired area on the first electrode film by causing molecules to be self-assembled; a patterning process of patterning the monomolecular film to remove a portion of the monomolecular film having the rectangular shape of the piezoelectric film and exposing a portion of the first electrode film having the rectangular shape; an application process of applying a precursor solution of a piezoelectric material to the portion of the first electrode film exposed in the rectangular shape, wherein the precursor solution of the piezoelectric material is to be the piezoelectric film; a piezoelectric film forming process of converting the applied precursor solution into the piezoelectric film; and a second electrode film forming process of forming a second electrode film on the formed piezoelectric film, wherein the second electrode film is to be a second electrode. A material of the precursor solution, a material of the first electrode film, and a material of the monomolecular film are adjusted so that the first electrode film is lyophilic with respect to the precursor solution of the piezoelectric material and the monomolecular film is lyophobic with respect to the precursor solution of the piezoelectric material. The piezoelectric film forming process includes a drying and thermally decomposing process of drying and thermally decomposing the applied precursor solution; and a crystallizing process of crystallizing the thermally decomposed piezoelectric material.

In another aspect, there is provided a liquid discharge head having a piezoelectric actuator, the piezoelectric actuator being formed on a substrate by a method, the piezoelectric actuator including a first electrode and a second electrode that sandwich a piezoelectric film having a rectangular shape, the piezoelectric film being deformed by applying an electric voltage through the first electrode and the second electrode, the method including a first electrode film forming process of forming a first electrode film on the substrate on which the piezoelectric actuator is to be formed, wherein the first electrode film is to be the first electrode; a monomolecular film forming process of forming a monomolecular film at a desired area on the first electrode film by causing molecules to be self-assembled; a pattering process of patterning the monomolecular film to remove a portion of the monomolecular film having the rectangular shape of the piezoelectric film and exposing a portion of the first electrode film having the rectangular shape; an application process of applying a precursor solution of a piezoelectric material to the portion of the first electrode film exposed in the rectangular shape, wherein the precursor solution of the piezoelectric material is to be the piezoelectric film; a piezoelectric film forming process of converting the applied precursor solution into the piezoelectric film; and a second electrode film forming process of forming a second electrode film on the formed piezoelectric film, wherein the second electrode film is to be a second electrode. A material of the precursor solution, a material of the first electrode film, and a material of the monomolecular film are adjusted so that the first electrode film is lyophilic with respect to the precursor solution of the piezoelectric material and the monomolecular film is lyophobic with respect to the precursor solution of the piezoelectric material. The piezoelectric film forming process includes a drying and thermally decomposing process of drying and thermally decomposing the applied precursor solution; and a crystallizing process of crystallizing the thermally decomposed piezoelectric material.

In another aspect, there is provided an inkjet printer including a liquid discharge head having a piezoelectric actuator, the piezoelectric actuator being formed on a substrate by a method, the piezoelectric actuator including a first electrode and a second electrode that sandwich a piezoelectric film having a rectangular shape, the piezoelectric film being deformed by applying an electric voltage through the first electrode and the second electrode, the method including a first electrode film forming process of forming a first electrode film on the substrate on which the piezoelectric actuator is to be formed, wherein the first electrode film is to be the first electrode; a monomolecular film forming process of forming a monomolecular film at a desired area on the first electrode film by causing molecules to be self-assembled; a patterning process of patterning the monomolecular film to remove a portion of the monomolecular film having the rectangular shape of the piezoelectric film and exposing a portion of the first electrode film having the rectangular shape; an application process of applying a precursor solution of a piezoelectric material to the portion of the first electrode film exposed in the rectangular shape, wherein the precursor solution of the piezoelectric material is to be the piezoelectric film; a piezoelectric film forming process of converting the applied precursor solution into the piezoelectric film; and a second electrode film forming process of forming a second electrode film on the formed piezoelectric film, wherein the second electrode film is to be a second electrode. A material of the precursor solution, a material of the first electrode film, and a material of the monomolecular film are adjusted so that the first electrode film is lyophilic with respect to the precursor solution of the piezoelectric material and the monomolecular film is lyophobic with respect to the precursor solution of the piezoelectric material. The piezoelectric film forming process includes a drying and thermally decomposing process of drying and thermally decomposing the applied precursor solution; and a crystallizing process of crystallizing the thermally decomposed piezoelectric material.

As described above, according to the embodiments, a novel piezoelectric producing method can be provided. In the producing method, since the precursor solution is applied on the first electrode film by the inkjet method, an appropriate amount of the precursor solution can be accurately applied at the application position. The applied precursor solution is repelled by a lyophobic monomolecular layer. Therefore, the applied precursor solution properly stays at the exposed first electrode film portion, and a piezoelectric film, which is more suitable for a piezoelectric film formation process, is formed. In this manner, with the producing method according to the embodiments, a favorable piezoelectric actuator can be formed on a substrate easily and at low cost.

By producing the piezoelectric actuator of the liquid discharge head using this producing method, the cost for producing the liquid discharge head and the inkjet printer including the liquid discharge head can be reduced.

Other objects, features and advantages of the present invention will become more apparent from the following detailed description when read in conjunction with the accompanying drawings.

DETAILED DESCRIPTION OF THE PREFERRED EMBODIMENTS

Hereinafter, the embodiments are explained.

<First Embodiment>

Figure 1A:
FIGS. 1A through 1F are diagrams illustrating a method of producing a piezoelectric actuator.

Here, a first embodiment is explained by referring to FIGS. 1A-1F and FIGS. 2A-2F. FIGS. 1A-1F are diagrams illustrating a monomolecular film forming process and a patterning process. FIG. 1A shows a state where a first electrode film 1A is uniformly formed on a surface of an Si substrate 1 by a first electrode film forming process.

In the first electrode film forming process, the first electrode film 1A is produced by forming a film of platinum as the material of the electrode on the Si substrate 1 by sputtering. Namely, the first electrode film 1A is a platinum film.

Then, in the monomolecular film forming process, a self-assembled monolayer (SAM) film is formed on the surface of the platinum film. Here, the SAM film is a monomolecular film.

The SAM film is obtained by immersing the first electrode film 1A on the surface of the substrate 1 into an alkanethiol solution and by causing the molecules to be self-assembled.

In the first embodiment, "$CH_3(CH_2)$—SH" is used as the alkanethiol solution.

Figure 1B:
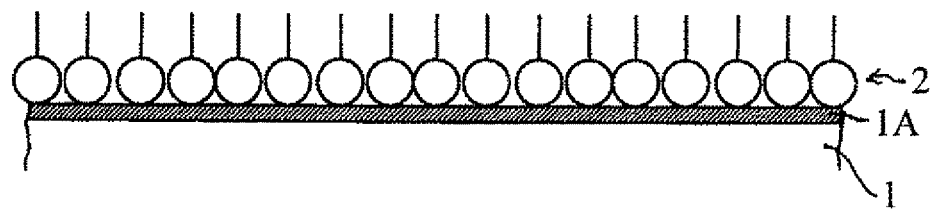

FIG. 1B shows a state where the molecules (ML) of "$CH_3(CH_2)$—SH" are self-assembled and a SAM film 2 is formed.

On the SAM film 2 formed in this manner, a layer of a photoresist 3 is formed. Then, the photoresist placed on portions of the SAM film to be removed is removed by photolithography.

Figure 1C:
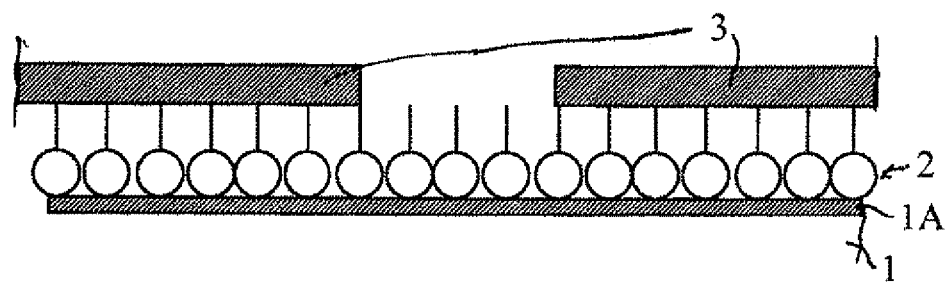

FIG. 1C shows a state where the photoresist 3 is removed.

Figure 1D:
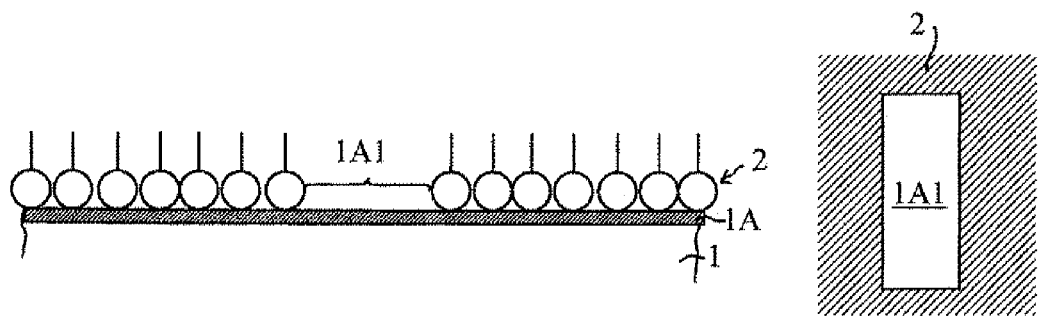

In this state, for example, by irradiating oxygen plasma, the portions of the SAM film 2 that are not coated by the remaining photoresist 3 are removed, so as to form rectangular areas on which piezoelectric films are to be formed. Then portions of the surface of the platinum film (first electrode film) 1A formed on the surface of the substrate 1 are exposed. The shapes of the exposed portions of the platinum film 1A are congruent with the rectangular shapes of the piezoelectric films. Further, the remaining photoresist 3, which has been utilized as a mask during the irradiation of the oxygen plasma, is removed. The left hand side of FIG. 1D shows this state. As shown in the left hand side of FIG. 1D, a portion of the surface of the platinum film 1A is exposed in the area indicated by a reference numeral 1A1. The area 1A1, in which the portion of the platinum film 1A is exposed, has a rectangular shape, and the longitudinal direction of the rectangular shape is perpendicular to the plane of paper in the left hand side of FIG. 1D.

The right hand side of FIG. 1D shows the portion of the platinum film 1A1, which is surrounded by the SAM film 2 and exposed in the rectangular shape. The rectangular shape has a length of 1 mm in the longitudinal direction and the width (the length in the short hand direction) of 80 μm.

Incidentally, the method of removing the SAM film 2 is not limited to the irradiation of the oxygen plasma. For example, the SAM film 2 may be removed by irradiating UV light.

Figure 1E:
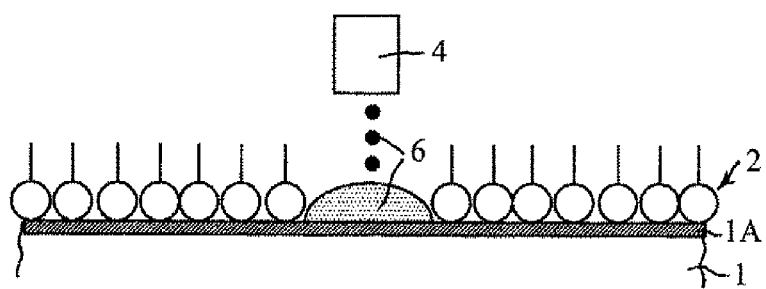

Subsequently, as shown in FIG. 1E, a precursor solution 6 is applied using a liquid discharge head 4 of an inkjet application device.

As starting materials of a solution for forming the precursor solution, lead acetate trihydrate, titanium isopropoxide, and zirconium isopropoxide are utilized. After crystal water of lead acetate is dissolved in methoxyethanol, the crystal water of lead acetate is dehydrated, and an amount of lead is adjusted to exceed by 10% mole fraction the amount of lead defined by the stoichiometric composition. This is for preventing a so-called "degradation of crystallinity caused by insufficient lead" during a heating process.

A PZT precursor solution (a precursor solution of a piezoelectric film material that becomes a piezoelectric film) is synthesized as follows. First, titanium isopropoxide and zirconium isopropoxide are dissolved into methoxyethanol. Then the alcohol exchange reaction and the esterification reaction are accelerated. The PZT precursor solution is synthesized by mixing the resultant solution with the above described methoxyethanol solution, in which lead acetate is dissolved. The molar concentration of the PZT is adjusted to be 0.1 mol/L.

Hereinafter, the precursor solution 6 may also be denoted as the PZT precursor solution 6.

The SAM film 2 is lyophobic with respect to the precursor solution 6, and the surface of the exposed platinum film 1A1 is lyophilic with respect to the precursor solution 6.

Therefore, when the PZT precursor solution 6 is applied to the exposed platinum film 1A1 using the liquid discharge head 4, the precursor solution 6 wets and adheres to the surface of the exposed lyophilic platinum film 1A1, but the precursor solution 6 is repelled by and does not adhere to the lyophobic SAM film 2. FIG. 1E shows a state where the precursor solution 6 is applied to the surface of the exposed platinum film 1A1. By the contrast between the contact angles (the difference between the lyophilic property and the lyophobic property), the precursor solution 6 only spreads across the lyophilic platinum film 1A1 and forms a rectangular shaped pattern.

As a first heating process (solvent drying process), the applied precursor solution 6 is heated to 120 degrees Celsius, and subsequently a thermal decomposition process is performed for organic materials. After the first heating process is performed, the applied precursor solution 6 is dried and a film shape is formed by reducing the thickness. For convenience sake, hereinafter, the dried precursor solution 6 having the film shape is referred to as a precursor film.

Figure 1F:
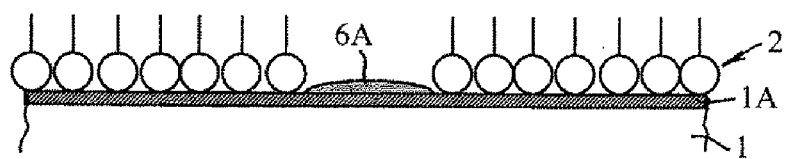

In FIG. 1F, the reference numeral 6A shows the precursor film that is obtained by the thermal decomposition process.

As the thickness of the precursor film 6A that is obtained by performing the first heating process on the precursor solution 6, which is applied in a single application process, thickness of about 100 nm is preferable at the center portion in the longitudinal direction of the precursor film 6A. The concentration of the precursor solution 6, which is applied in the single application process by the liquid discharge head 4, is adjusted in accordance with a relationship between a film forming area and an application amount of the precursor solution 6. In the first embodiment, the thickness of the precursor film 6A, which is formed by applying the thermal decomposition process and has the rectangular shape, at the center portion in the longitudinal direction is 90 nm.

Subsequently, "a repeating process" is performed.

Figure 2A:
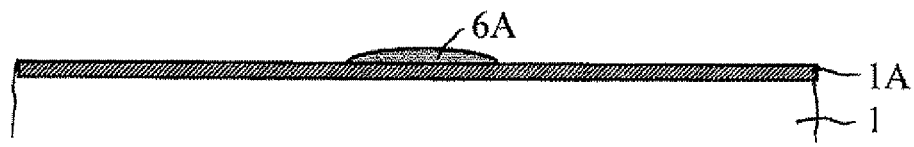
FIGS. 2A through 2F are diagrams illustrating the method of producing the piezoelectric actuator.
Figure 2B:
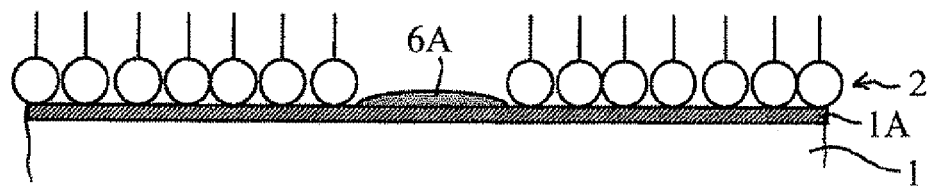

When a cleaning process using isopropyl alcohol is applied to the state shown in FIG. 1F, the SAM film 2 on the platinum film 1A is removed and the state becomes that shown in FIG. 2A. After the cleaning process, the SAM film 2 is formed again by an immersing process, which is similar to the above described immersing process. The SAM film 2 is formed by the combination of the platinum film 1A, which is the first electrode film, and molecules of the alkanethiol. The SAM film 2 is not formed on the precursor film 6A. Therefore, in the second and subsequent monomolecular film forming processes included in the repeating process, the SAM film 2 is formed in a state where the patterning of the rectangular shapes is automatically performed. FIG. 2B shows a state of the SAM film, for which the patterning is automatically performed.

Namely, the SAM film 2 is lyophobic to the precursor solution 6, but the precursor film 6A, on which the thermal decomposition process has been performed, is lyophilic to the precursor solution 6.

In this state, the PZT precursor 6 is applied by the liquid discharge head 4 of the inkjet application device, while the position of the liquid discharge head 4 is aligned to the precursor film 6A, which has been formed in the previous process.

Figure 2C:
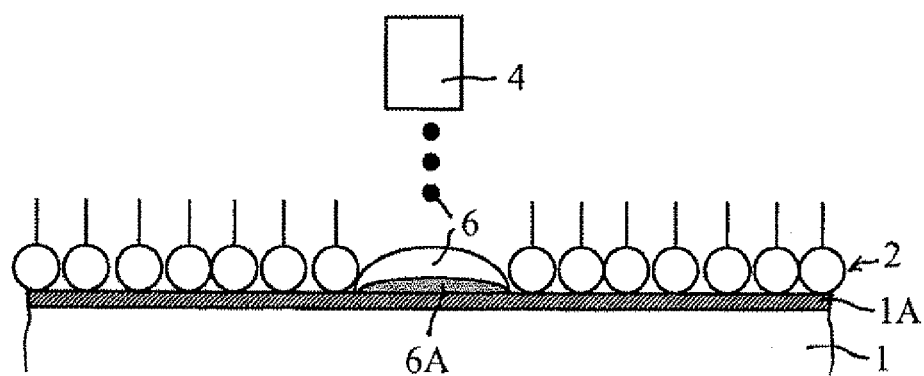

FIG. 2C shows this state. The applied precursor solution 6 is layered on the precursor film 6A.

Subsequently, when the drying process and the thermal decomposition process are performed by performing a heating process, which is similar to the first heating process, the layered precursor solution 6 is dried and thermally decomposed. Consequently, the layered precursor solution 6 is integrated with the previously formed precursor film 6A, and a precursor film 6B is obtained. The thickness of the precursor film 6B is 180 nm.

Figure 2D:
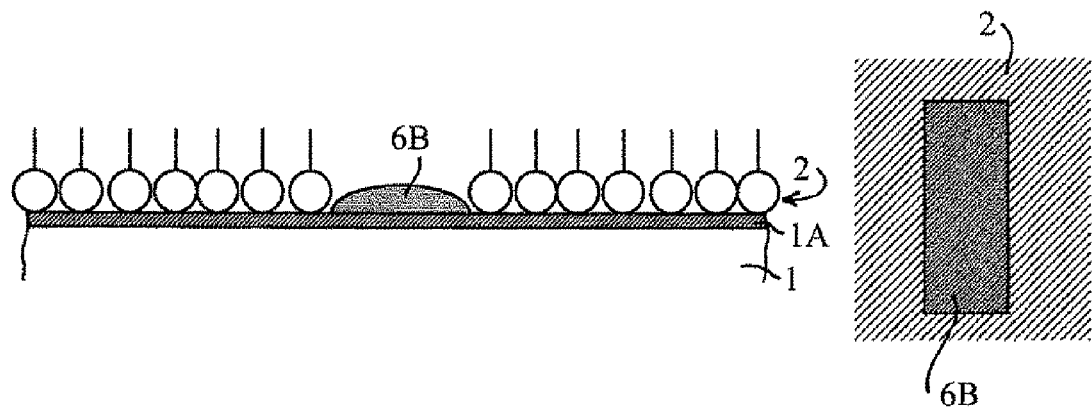

The left hand side of FIG. 2D shows this state. The left hand side of FIG. 2D shows that the precursor film 6B is formed at the area where the patterning is performed on the SAM film 2 to form the rectangular shape.

The above described process is repeated 6 times. Then the precursor film having thickness of 540 nm is obtained. Subsequently, as a crystallization process, rapid thermal annealing (RTA), which is a crystallization heating process, is performed at temperature of 700 degrees Celsius. During this process, a failure, such as a crack on the precursor film, did not occur.

Figure 2E:
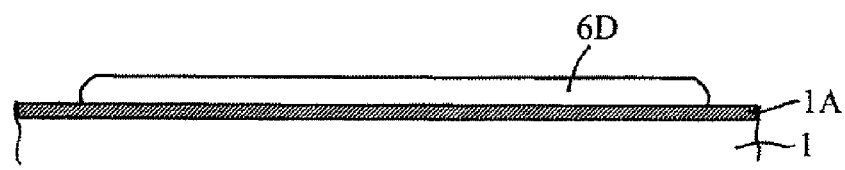

During the crystallization process, the precursor components of the precursor film are crystallized and PZT crystals are formed. Therefore, the precursor film having the thickness of 540 nm is transformed into a piezoelectric film. FIG. 2E shows a state where the piezoelectric film 6D is formed on the surface of the first electrode film 1A, which is formed of the platinum film on the Si substrate 1.

Figure 2F:
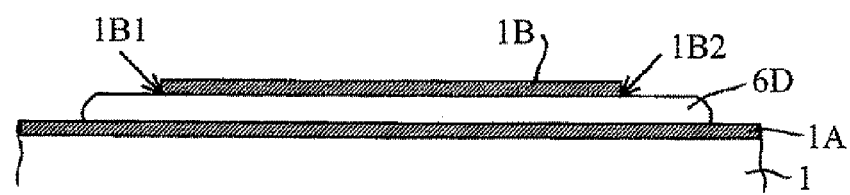

After forming the piezoelectric film 6D, a second electrode film 1B, which is made of platinum, is formed on the piezoelectric film 6D, and a piezoelectric actuator is obtained as shown in FIG. 2F.

In FIGS. 2E and 2F, the left and right direction is the longitudinal direction of the rectangular shape. The thickness of the piezoelectric film 6D is constant (180 nm) from the center portion to the close vicinities of the end portions along the longitudinal direction. The thicknesses of the piezoelectric film 6D at end portions 1B1 and 1B2 (referred to as edge thickness) of the second electrode film 1B in the longitudinal direction are also 180 nm.

Here, the edge thicknesses are the thicknesses of the piezoelectric film at positions shifted by 0.1X (length: 10% of X) toward the center portion from the edge portions of the piezoelectric film along the longitudinal direction, where X represents the length of the piezoelectric film in the longitudinal direction.

Incidentally, the second electrode film 1B may be formed by a suitable known method. The second electrode film 1B may be formed by the inkjet method.

<Second Embodiment>

From the state shown in FIG. 2D, the above described repeating process is further repeated 4 times. Then the piezoelectric film having the thickness of 540 nm is obtained. Further, the crystallization process is collectively performed after forming the 6 layers of the piezoelectric films.

To the piezoelectric film having the thickness of 540 nm, which has been formed in this manner, the SAM film forming process, the precursor solution applying process, the drying process at the temperature of 120 degrees in Celsius, the thermal decomposition process at the temperature of 500 degrees in Celsius, and the crystallization process at the temperature of 700 degrees in Celsius are repeated 6 times. Consequently, 6 layers of piezoelectric films, each of the piezoelectric films having thickness of 90 nm, are formed on the piezoelectric film having the thickness of 540 nm.

The film thickness of the first layer directly formed on the first electrode film is 540 nm as described above, and the thickness of each of the 6 layers of the piezoelectric films laminated on the first layer is 90 nm.

For each of the 6 layers of the piezoelectric films laminated on the first layer, the application by the inkjet application device is controlled so that the length in the longitudinal direction of the piezoelectric film is smaller than the length in the longitudinal direction of the previously formed piezoelectric film, which has been formed immediately before the piezoelectric film is formed, by 20%.

In the application process, the same application conditions are applied at the both end portions of the piezoelectric film, so that the cross-sectional shape of the piezoelectric film becomes bilaterally symmetric in the longitudinal direction. No failure, such as crack, was observed on the film, to which the crystallization process had been applied.

Figure 3:
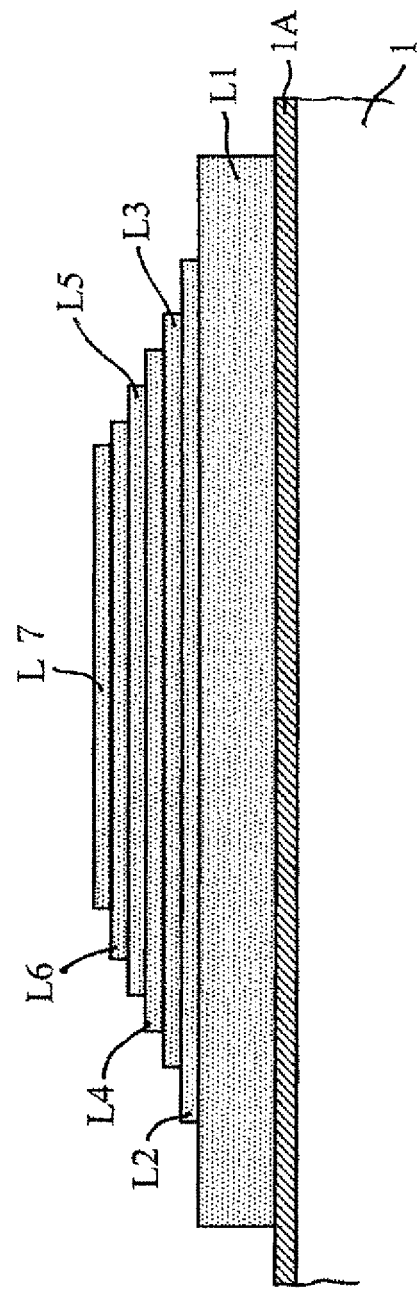
FIG. 3 is a diagram illustrating a piezoelectric film according to a second embodiment.

FIG. 3 is a diagram illustrating the piezoelectric film having the seven layer structure, which has been formed by the processes described above. As shown in FIG. 3, the seven layers of the piezoelectric films are referred to as a first layer L1, a second layer L2, ..., and a seventh layer L7, from the bottom. The left and right direction in FIG. 3 is the longitudinal direction. When the length in the longitudinal direction of the i-th layer (i=1, ..., 6) is denoted by $X_i$ the following equation holds as described above: $X_{i+1}=0.8X_i$.

The film thickness at the center portion reaches 1080 nm, and the film thickness at the end portions (the edge thickness of the first layer L1) is 540 nm. The center portions in the longitudinal direction of the layers L1 through the layers L7 are aligned with each other.

On the top surface of the seventh layer L7 of the piezoelectric film having the seven layer structure shown in FIG. 3, a second electrode film made of platinum is formed. Then the electrical characteristics and electro-mechanical transducing capability (piezoelectric constant) of the piezoelectric film are evaluated.

Figure 4:
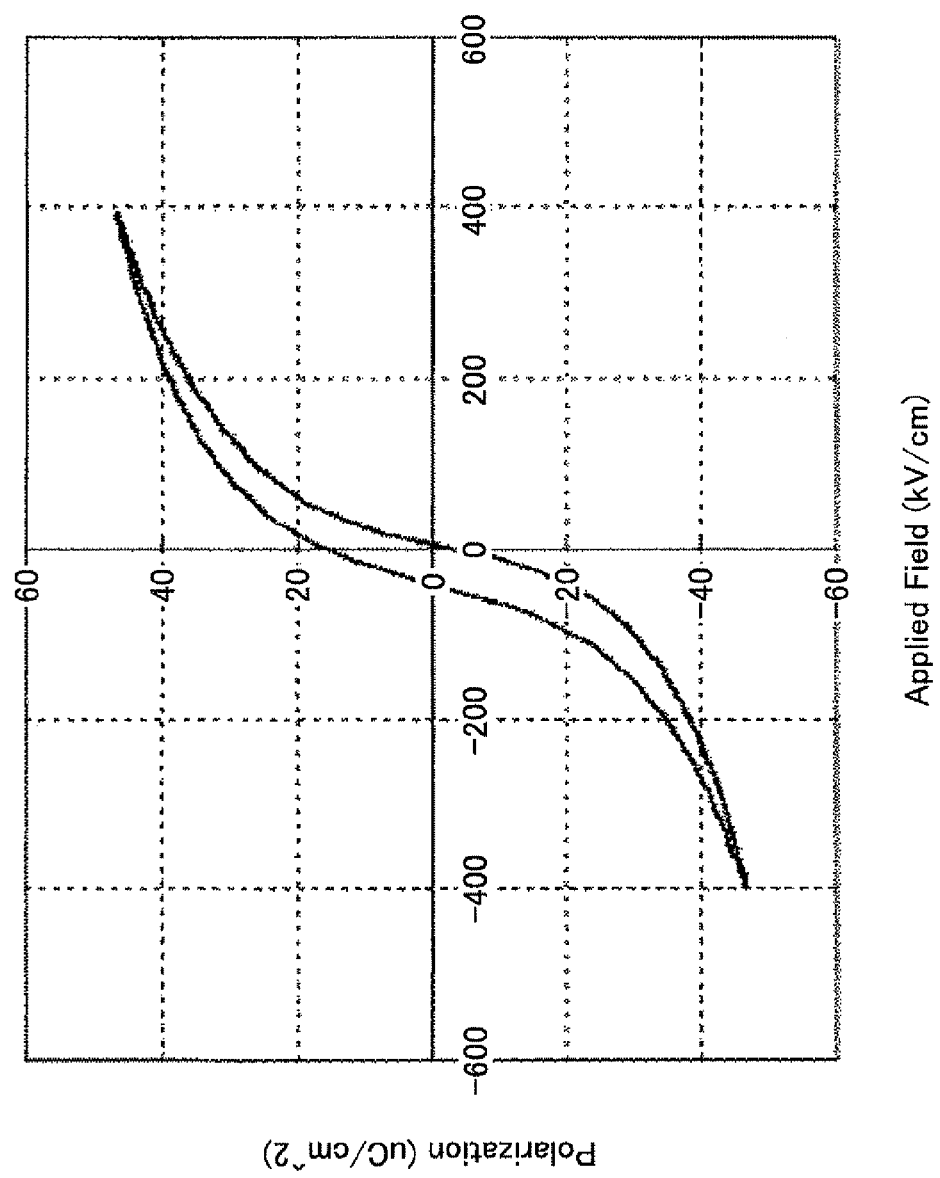
FIG. 4 is a diagram showing a P-E hysteresis curve of a piezoelectric actuator according to the second embodiment.

As the electrical characteristics, the piezoelectric film has a relative permittivity of 1163, a dielectric loss of 0.03, a residual polarization of 16.5 $\mu C/cm^2$, and a coercive electric field of 10.7 kV/cm. Thus the piezoelectric film has the electrical properties which are equivalent to electrical properties of a usual ceramics sintered body. FIG. 4 shows a P-E hysteresis curve. In FIG. 4 the horizontal axis indicates an applied electric field, and the vertical axis indicates polarizability.

The electro-mechanical transducing capability is calculated by measuring a deformation amount caused by application of an electric field using a laser doppler vibrometer and fitting the simulation result with the measurement result. The piezoelectric constant d31 (piezoelectric coefficient in the d31 direction of the crystal axis) of the piezoelectric film turns out to be 120 pm/V, which is equivalent to the piezoelectric constant of the ceramics sintered body. When the length of the piezoelectric film is shortened as the piezoelectric film is placed on a higher layer, as shown in FIG. 3, the restriction on the deformation at the center portion in the longitudinal direction by the end portions is reduced. Thus the deformation amount at the center portion can be enlarged.

Figure 5:
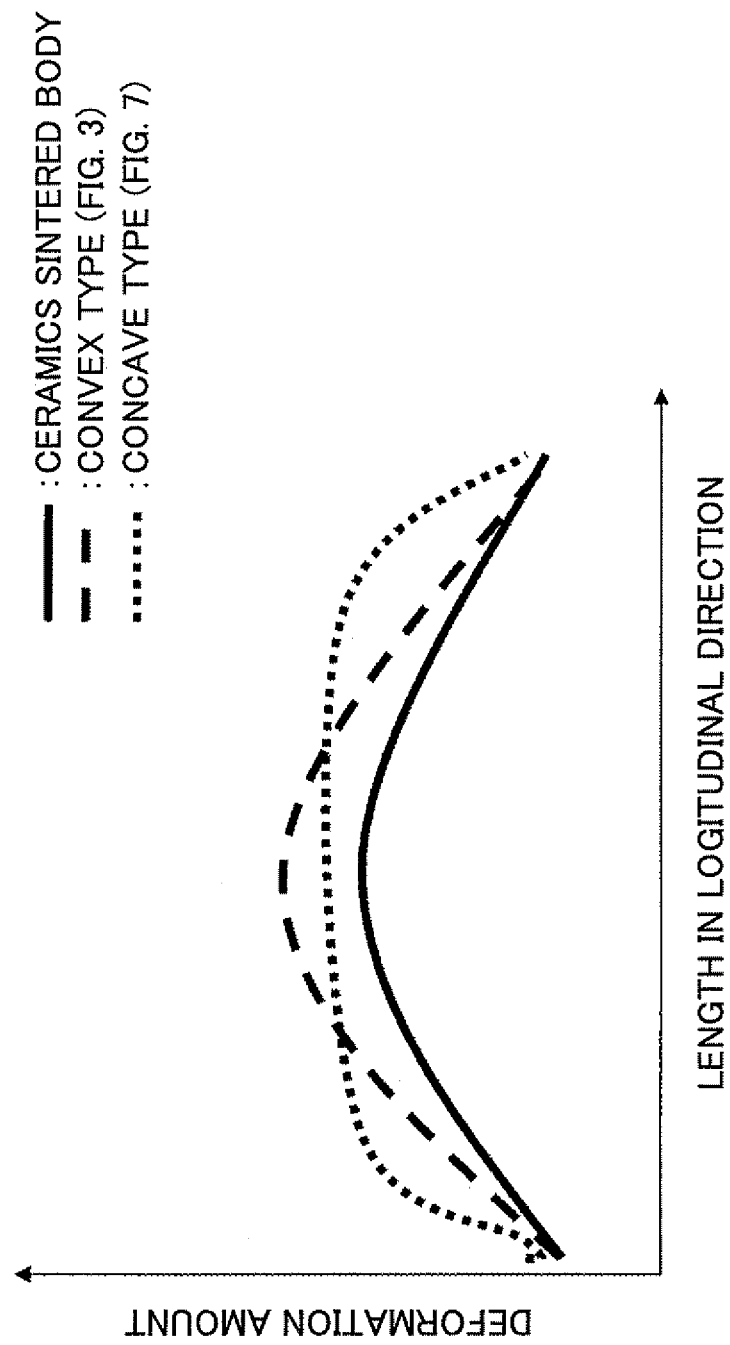
FIG. 5 is a diagram showing displacements in a longitudinal direction of the piezoelectric actuator according to the second embodiment and a piezoelectric actuator according to a third embodiment.

The dashed line in FIG. 5 shows the deformation amount in the longitudinal direction of the piezoelectric actuator according to the second embodiment. The deformation amount at the center portion is increased by 20% compared to the ceramics sintered body (solid line). This shows that the electrical characteristics of the piezoelectric actuator according to the second embodiment are sufficient for designing a piezoelectric actuator of a liquid discharge head.

It has been found that, for a piezoelectric actuator, which is the same type of piezoelectric actuator as the piezoelectric actuator shown in FIG. 3 which is formed of the piezoelectric film and the second electrode film formed thereon, when a magnification ratio R (=Tc/Te) between the thickness Tc at the center portion in the longitudinal direction and the edge thickness Te satisfies the inequality 1.25<R<3.0, the above described restriction by the edge portions is reduced, and the deformation amount at the center portion is enlarged.

Figure 6:
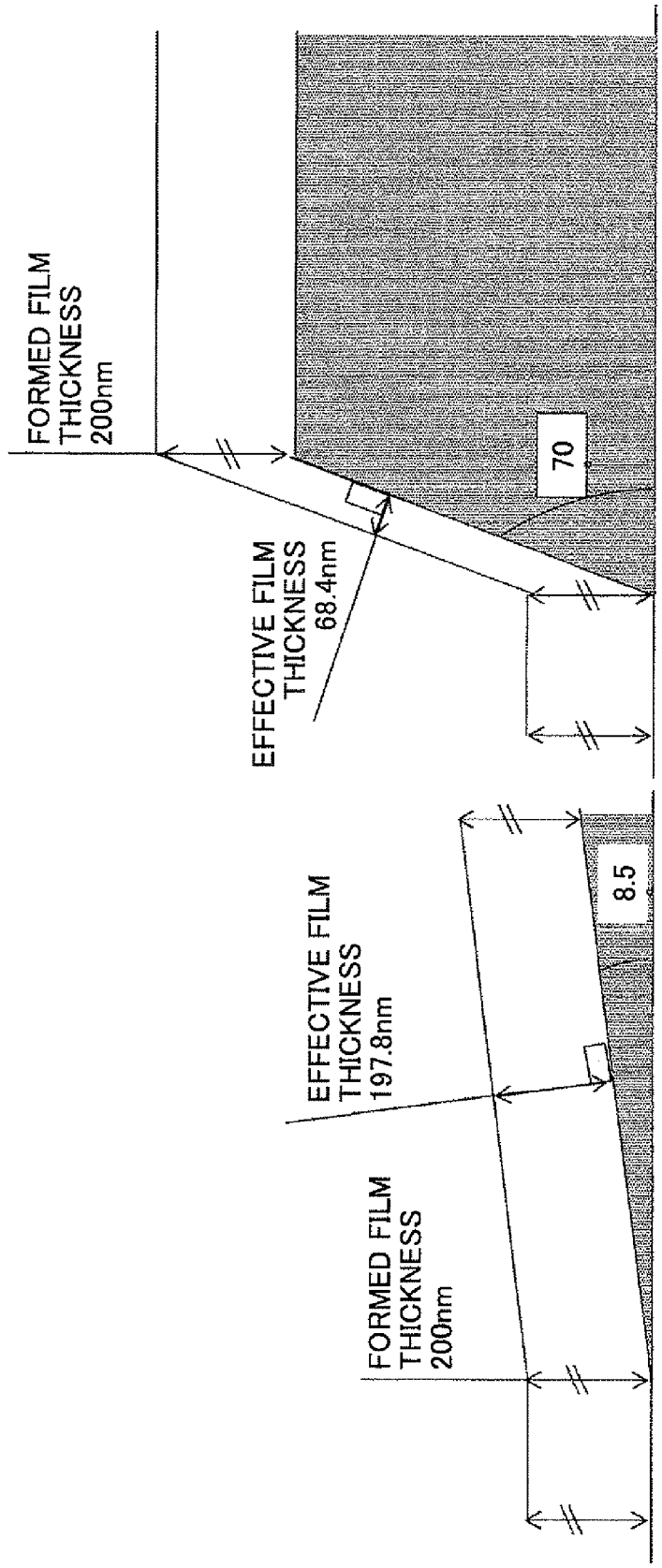
FIGS. 6A and 6B are diagrams illustrating a protective film that may be formed on the piezoelectric actuator.

A protection film made of silicon nitride and having thickness of 200 nm is formed by sputtering at a side of the second electrode film, which is included in the piezoelectric actuator explained along with FIG. 3, where the second electrode film made of platinum is formed on the piezoelectric film. It has been found by observing a cross-sectional surface of the piezoelectric actuator having the protection film that the end portion of the PZT in the longitudinal direction has a taper of 8.5 degrees toward the center portion as shown in FIG. 6A. The taper is continuous over 4.4 μm toward the center portion (the right side in the figure), and after that the thickness of the film is 540 nm, which is the edge thickness of the first layer, and no further taper is observed.

It has been found by observing the protection film formed on the piezoelectric film that, since the taper (8.5 degrees) at the end portion of the first layer is small, the film thickness of the protection film between the boundary surface and the outermost surface (the effective film thickness), where the boundary surface is the boundary between the piezoelectric film and the protection film, does not depend on the position in the longitudinal direction, and the effective film thickness is substantially kept constant. Specifically, the effective film thickness is 198 nm, and the ratio of the effective film thickness with respect to the formed film thickness is 99.4%. For the sake of comparison, PZT piezoelectric films formed by the spin-coating method or the sputtering method are prepared. In such a case, during the dry etching of the patterned resist, over-etching occurs and tapers are formed at the end portions of the piezoelectric films. The tapers are substantially within a range from 50 degrees to 70 degrees and relatively large. Therefore, when the protection film is formed under the condition which is the same as that of the above described PZT piezoelectric film having the small taper, the effective film thickness is 68.4 nm and the ratio of the effective film thickness with respect to the formed film thickness is 34.2%.

Namely, with the PZT piezoelectric film having the small taper, which is formed in the second embodiment, a desired film thickness of the protection film is more efficiently obtained.

<Third Embodiment>

Figure 7:
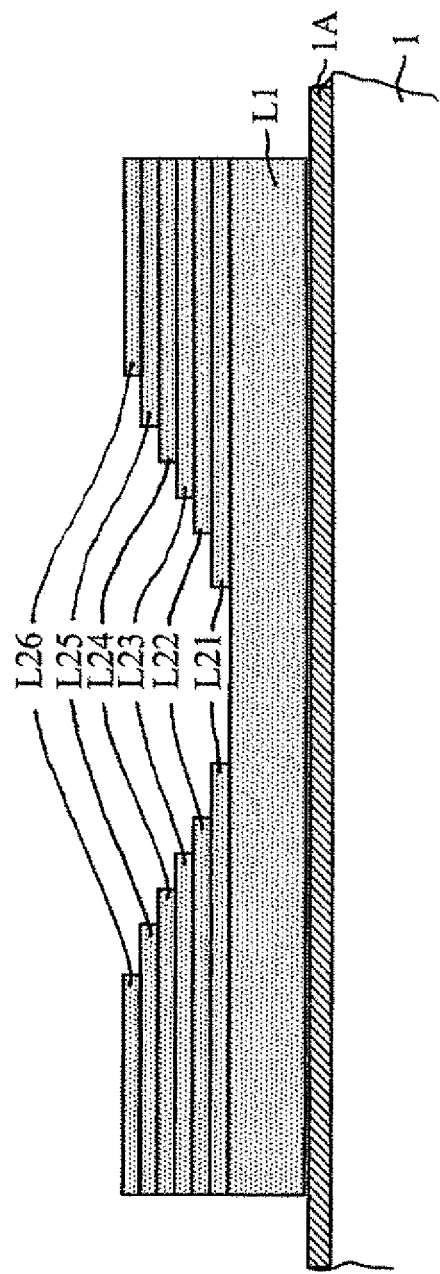
FIG. 7 is a diagram illustrating a configuration of a piezoelectric film according to the third embodiment.

A first layer of a piezoelectric film is formed by a process similar to the process of the second embodiment. Additionally, 6 layers of piezoelectric films are formed on the first layer. As shown in FIG. 7, each of the 6 layers L21-L26 of the piezoelectric films formed on the first layer L1 includes a left portion and a right portion. For each of the left portion and the right portion, the lengths of the second layer L21 through the seventh layer L26 on the first layer L1 (the lengths in the left and right direction in FIG. 7) are arranged such that the length of each of the third layer L22 through the seventh layer L26 is less than the length of the layer immediately below it by 10%. Therefore, the thickness of the piezoelectric film decreases along the direction from the left end portion in the longitudinal direction toward the center portion, and along the direction from the right end portion in the longitudinal direction toward the center portion. The thickness of the piezoelectric film is adjusted so that the thickness at the end portions is 1080 nm and the thickness at the center portion is 540 nm, which is the minimum film thickness.

At the end portions, the precursor solution is applied using the same condition, so that the cross-sectional shape of the seven layers of the piezoelectric films becomes bilaterally symmetric in the longitudinal direction. No cracks are observed in the piezoelectric film to which the crystallization treatment of the crystallization process is performed.

The second electrode film is formed on the piezoelectric film by platinum sputtering. Then the electrical characteristics and electro-mechanical transducing capability (piezoelectric constant) of the piezoelectric film are evaluated.

Figure 8:
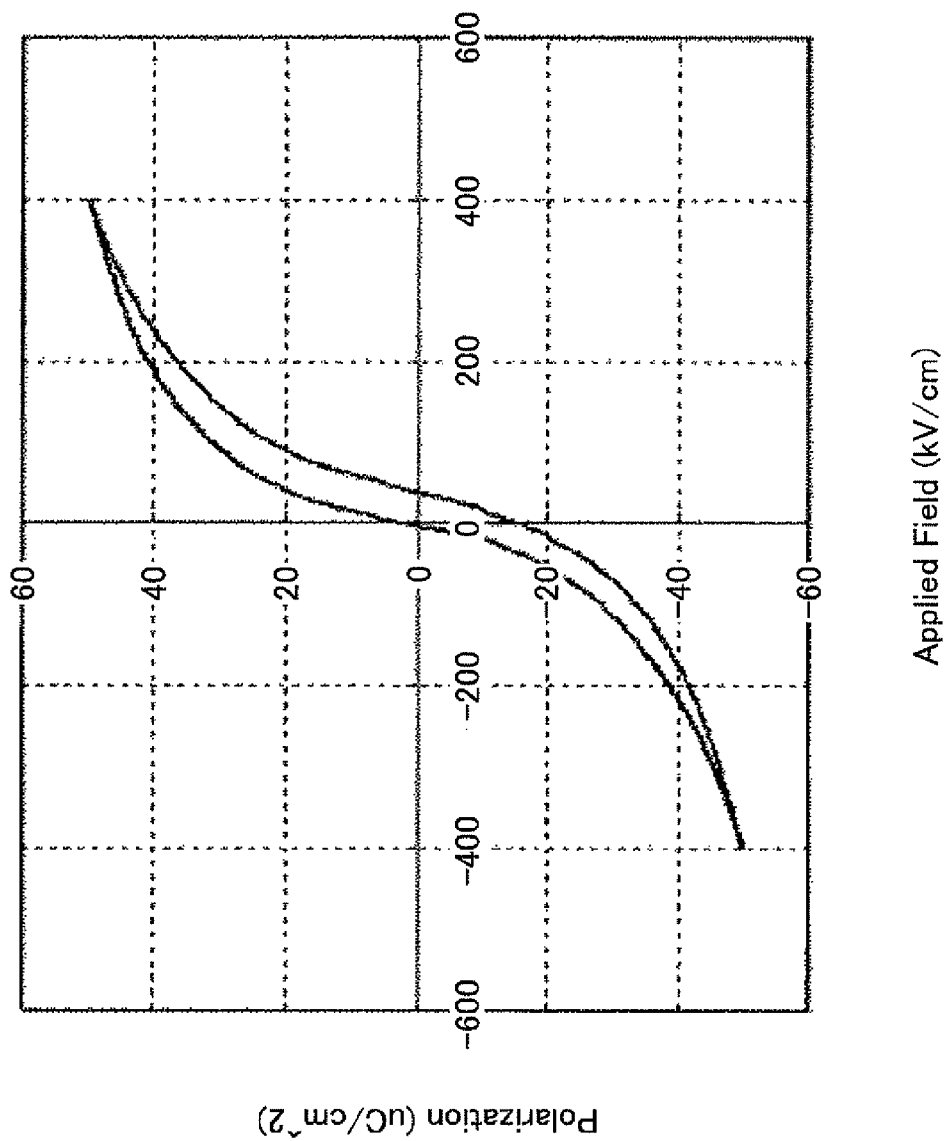
FIG. 8 is a diagram showing the P-E hysteresis of the piezoelectric actuator according to the third embodiment.

The piezoelectric film has a relative permittivity of 1163, a dielectric loss of 0.03, a residual polarization of 19.3 μC/cm², and a coercive electric field of 3.3 kV/cm. FIG. 8 shows a P-E hysteresis curve, which follows FIG. 4.

The electro-mechanical transducing capability is calculated by measuring a deformation amount caused by application of an electric field using a laser doppler vibrometer and fitting the simulation result with the measurement result. The piezoelectric constant d31 is 120 pm/V, which is also equivalent to the piezoelectric constant of the ceramics sintered body. Further, when the magnification ratio R (=Tc/Te) between the thickness Tc at the center portion in the longitudinal direction and the edge thickness Te satisfies the inequality 0.33<R<0.67, the deformation amount at the center portion is increased by 10% with respect to that of the ceramics sintered body, as shown by the dotted line in FIG. 5. As shown in FIG. 5, for the ceramics sintered body and the piezoelectric actuator satisfying the inequality 1.25<R<3.0, which is described in the second embodiment, the graph representing a relationship between a length in the longitudinal direction and a deformation amount has a convex shape (the solid line and the dotted line). However, for the piezoelectric actuator according to the third embodiment, the deformation amount is kept horizontal along the longitudinal direction as shown by the dotted line in FIG. 5. With such a deformation amount distribution, a stable oscillation mode of a liquid discharge head can be realized. The electrical characteristic of the piezoelectric actuator according to the third embodiment is sufficient for designing a piezoelectric actuator of a liquid discharge head.

The second electrode film may be formed on the piezoelectric film by the inkjet method. One embodiment for this case is explained by referring to FIG. 9.

Figure 9:
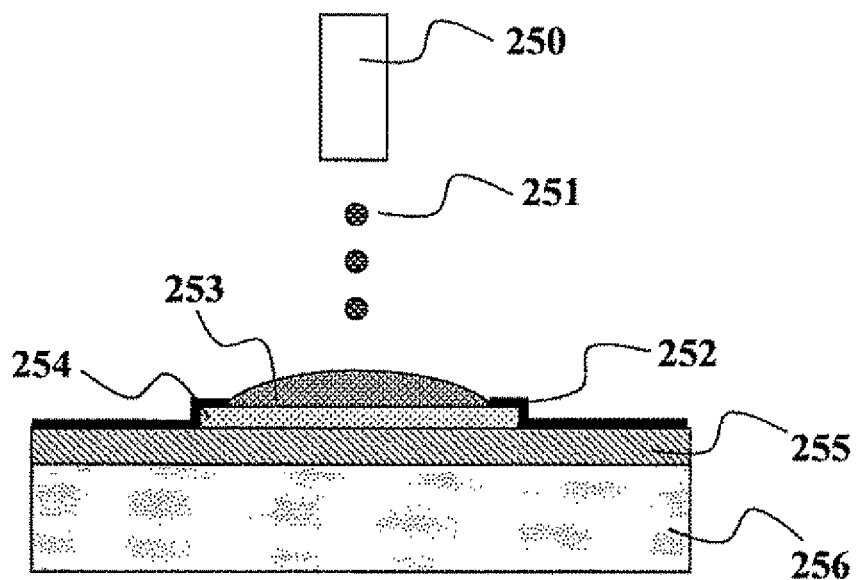
FIG. 9 is a diagram illustrating a process of forming a second electrode film by an inkjet method.

FIG. 9 is a cross-sectional diagram of the piezoelectric film, viewed in the longitudinal direction. In FIG. 9, the reference numeral 256 indicates a base substrate for supporting a substrate, the reference numeral 255 indicates a Si substrate, the reference numeral 254 indicates a first electrode film, and the reference numeral 253 indicates a piezoelectric film formed of the PZT crystal.

A liquid discharge head 250 of an inkjet application device is filled with a liquid, in which fine platinum particles are dispersed in the colloidal state. Then the liquid is applied by the inkjet method. For this application, the above described contrast between the contact angles is also utilized and the application area is regulated.

The material of the second electrode film may be applied to an area that is smaller than the film pattern of the piezoelectric film 253 formed of the PZT crystal, so as to prevent a short. Therefore, a lyophobic area that repels the above described liquid may be formed on the piezoelectric film 253.

To realize this, a pattern is formed with a resist 252 at an area where platinum is not applied. The application liquid including platinum is applied to the surface of the piezoelectric film 253, which is not covered with the resist 252. Then the application liquid including platinum is dried at 120 degrees in Celsius. Subsequently, the resist 252 is removed, and finally sintering at 250 degrees Celsius is performed.

After baking, the film thickness of the platinum film was 0.5 µm, and the specific resistance was 5×10$^{-6}$ Ωcm.

Figure 10:
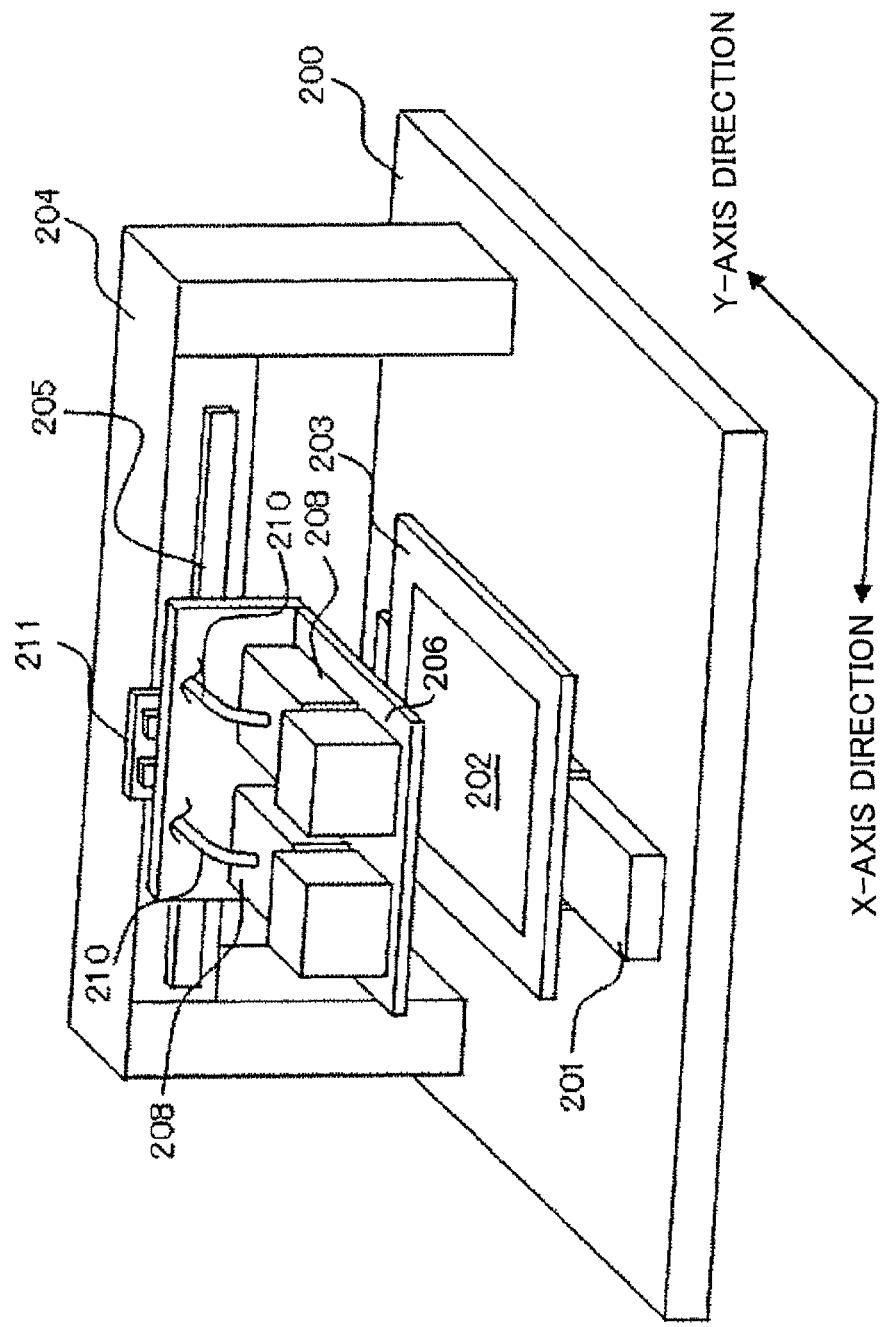
FIG. 10 is a diagram illustrating an inkjet application device.

Hereinafter, an example of the above inkjet application device is explained by referring to FIG. 10. FIG. 10 is a perspective view illustrating the inkjet application device. In FIG. 10, a Y-axis driving unit 201 is placed on a support 200. A stage 203 is placed on the Y-axis driving unit 201. The stage 203 can be driven in the Y-axis direction, and a substrate 202 (a subject of the application) is mounted on the stage 203. The stage 203 includes a suction unit (not shown in FIG. 10) that fixes the substrate 202. The suction unit utilizes, for example, a vacuum system or an electrostatic system.

An X-axis driving unit 205 is attached to an X-axis support member 204. A head base 206, which is mounted on a Z-axis driving unit 211, is attached to the X-axis driving unit 205. The head base 206 can be moved along the X-axis direction. A liquid discharge head 208 that discharges an application liquid is mounted on the head base 206. The application liquid is supplied from a liquid tank (not shown) to the liquid discharge head 208 through a supply pipe 210. Position alignment is performed with respect to the subject of the application by using the above described X-axis driving unit 205, Y-axis driving unit 201, and Z-axis driving unit 211, and the application is performed by discharging the application liquid from the liquid discharge head 208. Here, when the application liquid is the precursor solution, the subject of the application is the surface of the first electrode film that is exposed by patterning the SAM film. When the application liquid is the platinum liquid, the subject of the application is the surface of the piezoelectric film.

Figure 11:
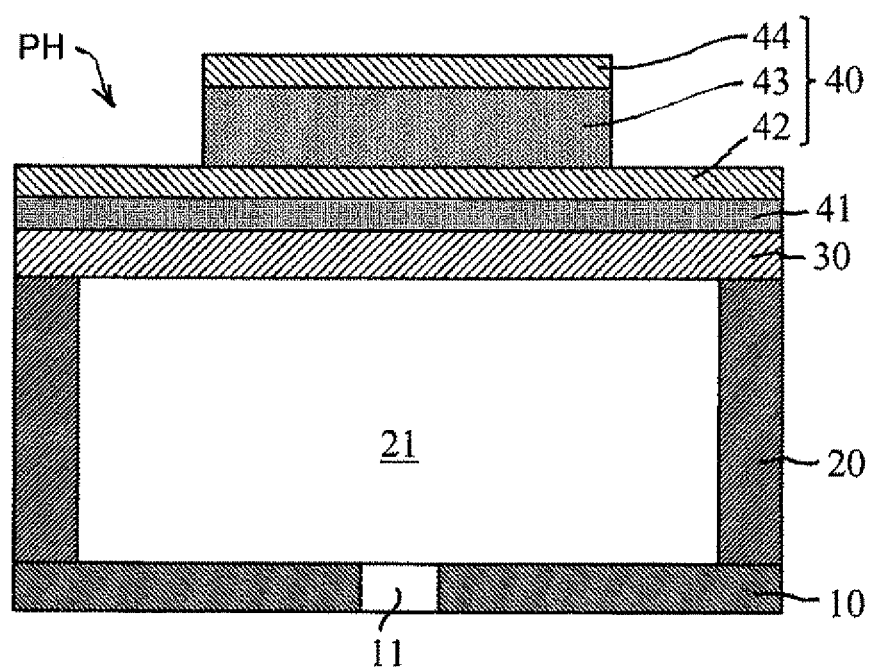
FIG. 11 is a diagram illustrating a liquid discharge head.
Figure 12:
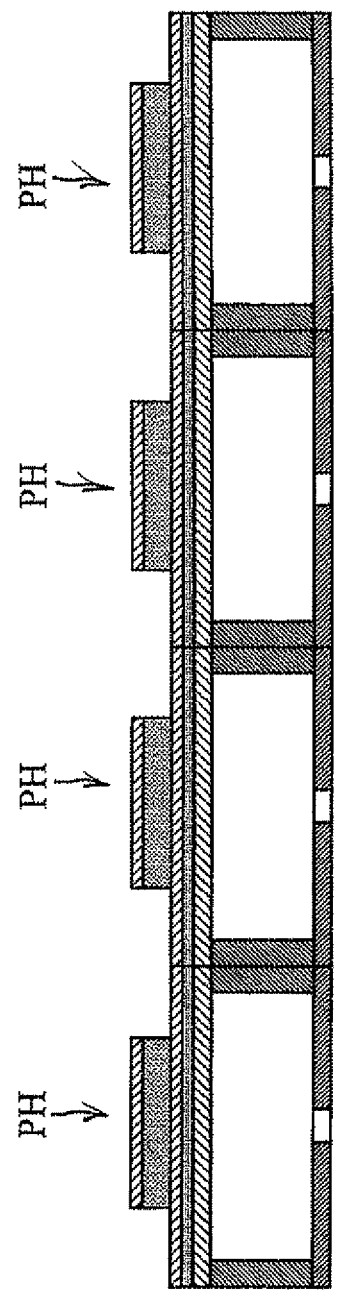
FIG. 12 is a diagram illustrating the liquid discharge head.

FIG. 11 shows a configuration of a liquid discharge head PH. FIG. 12 shows a state where the liquid discharge heads of FIG. 11 are arranged in an array. In FIG. 11, 4 sides of a pressure chamber 21 are surrounded by a nozzle plate 10, pressure chamber substrates 20, and an oscillation plate 30. Both end portions in the direction perpendicular to the plane of the paper are closed with plate members. The application liquid is supplied through a liquid pipe which passes through one of the plate members. The pressure chamber substrates 20 and the oscillation plate 30 are Si plates. As shown in FIG. 12, the pressure chamber substrates 20 are partition walls for dividing the neighboring pressure chambers.

In FIG. 11, the pressure chamber 21 has a cuboid shape such that its longitudinal direction is the direction perpendicular to the plane of the paper, and its length is slightly greater than 1 mm. A nozzle 11 is provided as a hole having a small diameter by drilling a side of one of end portions of the nozzle plate 10 in the longitudinal direction.

The pressure chamber 21 is filled with the supplied application liquid. The pressure chamber 21 causes the application liquid to be discharged from the nozzle 11 by deforming the oscillation plate 30 and applying pressure to the application liquid.

A first electrode film 42 is formed above the oscillation plate 30 through an adhesive layer 41. The first electrode film 42, a piezoelectric film 43, and a second electrode film 44 form a piezoelectric actuator 40. Here, the piezoelectric film 43 and the second electrode film 44 are formed on the first electrode film 42.

The piezoelectric actuator 40 deforms so as to cause the oscillation plate 30 to be deformed and cause the pressure to be applied to the application liquid.

The above described piezoelectric actuator can be produced by using the above described producing method. In this manner, the liquid discharge head can be realized. The piezoelectric actuator is not limited to the example shown in FIG. 11. For example, the piezoelectric actuators according to the second embodiment and the third embodiment may be arbitrary used.

For the liquid discharge heads shown in FIGS. 11 and 12, first a first electrode film 42 is formed on the Si substrate 30 through the adhesive layer 41, and the piezoelectric film 43 and the second electrode film 44 are formed on the first electrode film 42 by the above explained process. For the liquid discharge head shown in FIG. 12, plural piezoelectric actuators are formed at once.

After forming the piezoelectric actuator, a space, which is to be a pressure chamber 21 (the ceiling portion becomes the oscillation plate 30), is formed by etching the rear side of the Si substrate 30. Subsequently, the nozzle plate 10 is joined to the pressure chamber 21 and the space is closed. Here, the nozzle 11 is formed by drilling the nozzle plate 10. In this manner, the liquid discharge head PH is formed.

Figure 13:
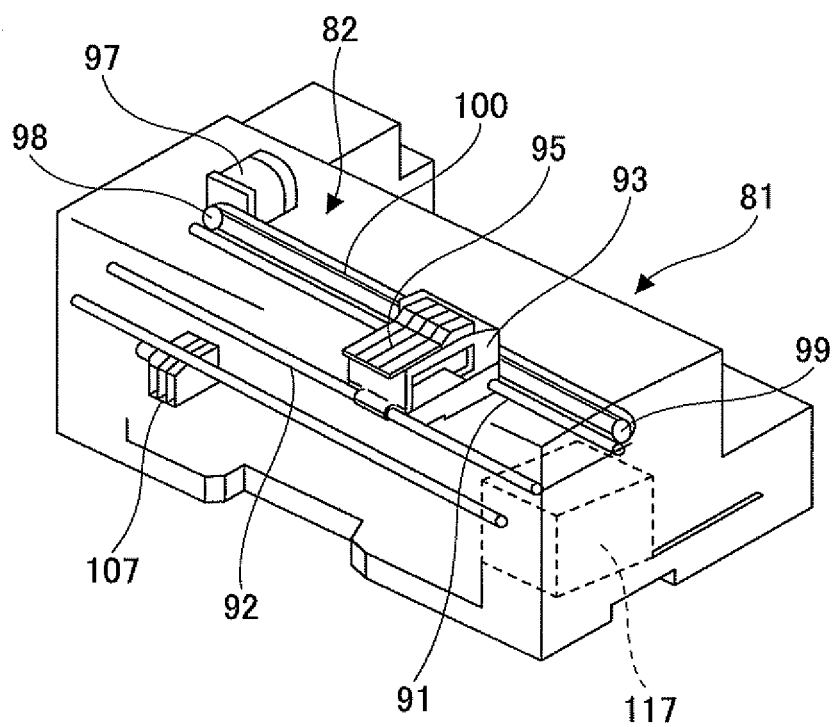
FIG. 13 is a diagram illustrating an inkjet printer.
Figure 14:
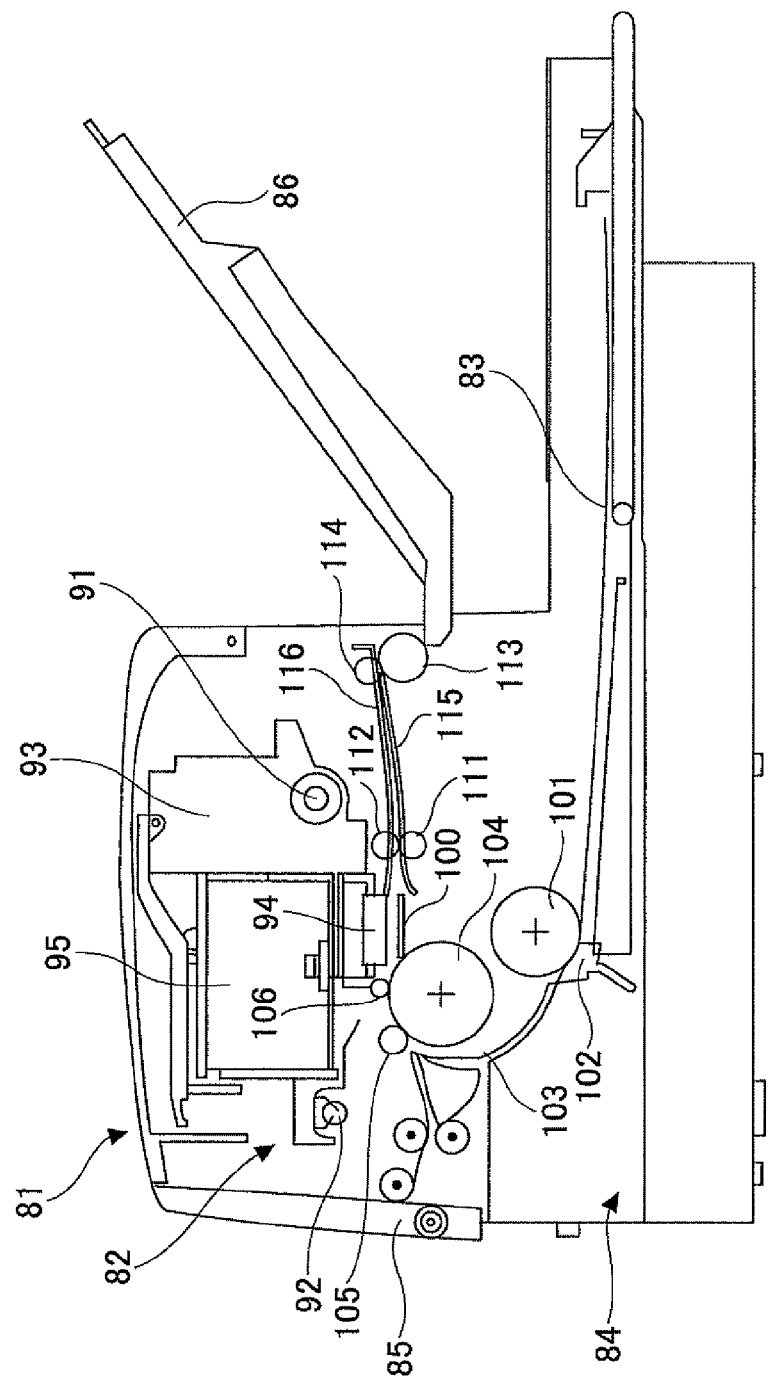
FIG. 14 is a diagram illustrating the inkjet printer.

Finally, an embodiment of an inkjet printer is explained by referring to FIGS. 13 and 14. FIG. 13 is a perspective explanatory view of the inkjet printer, and FIG. 14 is a side explanatory view of mechanical portions of the inkjet printer. The inkjet printer includes a printing unit 82 and the like inside a main body 81 of the inkjet printer. Here, the printing unit 82 includes a carriage 93, which is moveable in the main scanning direction; a recording head 94 including liquid discharge heads that are mounted on the carriage; and ink cartridges 95 that supply corresponding inks to the recording head 94. Here, the inks are the liquids to be discharged. A sheet feeding cassette 84 (or a sheet feeding tray), on which many sheets 83 can be stacked, can be detachably attached to a lower portion of the main body 81. Further, a manual feed tray 85 for manually feeding the sheets 83 can be opened and tilted at a lower portion of the main body 81. The inkjet printer takes in the sheet 83 fed from the sheet feeding cassette 84 or the manual feed tray 85, and after recording a desired image by the printing unit 82, the inkjet printer discharges the sheet 83 onto a sheet discharge tray 86.

The print unit 82 supports the carriage 93 through a main guide rod 91 and a sub guide rod 92. The main guide rod 91 and the sub guide rod 92 are guide members supported by left and right side plates (not shown). The carriage 93 can be slid in the main scanning direction. The head 94 is attached to the carriage 93. The head 94 includes liquid discharge heads (inkjet heads) which discharge yellow (Y) ink droplets, cyan (C) ink droplets, magenta (M) ink droplets, and black (Bk) ink droplets, respectively. Here, the head 94 is attached to the carriage 93 so that plural ink discharge ports (nozzles) are arranged in a direction intersecting the main scanning direction, and ink droplets discharging is directed downward. Ink cartridges 95 for supplying the yellow (Y) ink, the cyan (C) ink, the magenta (M) ink, and the black (Bk) ink, respectively, to the head 94 are attached to the carriage 93. Each of the ink cartridges 95 includes an air inlet that communicates with the outside air; a supply port for supplying the corresponding ink to the corresponding inkjet head; and a porous body filled with the corresponding ink. The air inlet is arranged at an upper portion of the ink cartridge 95. The supply port is arranged at a lower portion of the ink cartridge 95. The porous body is arranged inside the ink cartridge 95. Here, as the recording head, the head 94 including the liquid discharge heads which discharge the yellow (Y) ink droplets, the cyan (C) ink droplets, the magenta (M) ink droplets, and the black (Bk) ink droplets is utilized. However, the recording head may be a single head having nozzles for discharging yellow (Y) ink droplets, cyan (C) ink droplets, magenta (M) ink droplets, and the black (Bk) ink droplets. A rear side of the carriage 93 (downstream side in the sheet conveyance direction) is slidably fixed to the main guide rod 91, and a front side of the carriage 93 (upstream side in the sheet conveyance direction) is slidably placed on the sub guide rod 92. In order to cause the carriage 93 to move and scan in the main scanning direction, a timing belt 100 is hung around a drive pully 98 being rotationally driven by a main scanning motor 97 and a driven pully 99, and the timing belt 100 is fixed to the carriage 93. Thus the carriage 93 reciprocates by the forward and reverse rotations of the main scanning motor 97. The inkjet printer includes a sheet feeding roller 101 and a friction pad 102 for feeding the sheets 83 one by one from the sheet feeding cassette 84 and for separating the sheets 83; a guide member 103 for guiding the sheet 83; a conveyance roller 104 that inverts the sheet 83 being fed and conveys the sheet 83; a pressing roller 105 that is pressed to a peripheral surface of the conveyance roller 104; and a tip end roller 106 that defines an angle of sending the sheet 83 from the conveyance roller 104, so as to convey the sheet 83 being fed from the sheet feeding cassette 84 to a lower side of the head 94. The conveyance roller 104 is rotationally driven by a sub-scanning motor 107 through a sequence of gears.

The inkjet printer includes a printing support member 109 that corresponds to a moving range in the main scanning direction of the carriage 93 and that is for guiding the sheet 83 being sent from the conveyance roller 104 at the lower side of the recording head 94. At the downstream side in the sheet conveyance direction of the printing support member 109, the inkjet printer further includes a conveyance roller 111 and a spur 112 that are rotationally driven so as to send the sheet 83 in a sheet discharging direction; a sheet eject roller 113 and a spur 114 for sending the sheet 83 onto the sheet discharge tray 86; and guide members 115 and 116 that form a paper ejection path. During recording, the recording head 94 is driven in accordance with an image signal while the carriage 93 is moved. In this manner, the recording head 94 discharges the inks onto the sheet 83, which has been stopped, and recording corresponding to one line is completed. Subsequently, the inkjet printer records the next line after moving the sheet 83 by a predetermined distance. When a recording termination signal or a signal indicating that the end of the sheet 83 has reached a recording area is received, the inkjet printer terminates the recording operation and discharges the sheet 83. The inkjet printer includes a recovering device 117 for recovering a discharge failure of the head 94. The recovering device 117 is arranged at a position outside the recording area. Here, the position is at a rightmost side in a direction in which the carriage 93 moves. The recovering device 117 includes a cap unit, a suction unit, and a cleaning unit. During the print waiting state of the inkjet printer, the carriage 93 is moved to the side of the recovering device 117, and the head 94 is capped by the cap unit. In this manner, the wet condition of the discharging ports is maintained, and a discharge failure caused by ink drying is prevented. During recording, the inkjet printer causes the head 94 to discharge ink that is not related to the recording. In this manner ink viscosities at all the discharging ports are kept constant, and a stable discharging performance is maintained. When a discharge failure occurs, the inkjet printer causes the cap unit to seal the discharging ports (nozzles) of the head 94. Then the suction unit suctions bubbles along with the inks from the discharging ports through a tube. The cleaning unit removes the ink or dust attached to a surface of the discharging ports. In this manner, the discharge failure is corrected. The suctioned inks are discharged to a waste ink reservoir (not shown) arranged at a lower portion of the main body of the inkjet printer, and an ink absorber in the waste ink reservoir absorbs and reserves the suctioned inks. As described above, since the inkjet printer includes the inkjet head according to the embodiment, an ink discharging failure caused by a failure of driving the oscillation plate is prevented. Therefore, a stable ink discharging characteristic is obtained and the quality of the image is improved.

The present invention is not limited to the specifically disclosed embodiments, and variations and modifications may be made without departing from the scope of the present invention.

The present application is based on Japanese Priority Application No. 2011-058254 filed on Mar. 16, 2011, the entire contents of which are hereby incorporated herein by reference.

What is claimed is:

1. A method of producing a piezoelectric actuator, the piezoelectric actuator including a first electrode and a second electrode that sandwich a piezoelectric film having a rectangular shape, the piezoelectric film being deformed by applying an electric voltage through the first electrode and the second electrode, the method comprising:
   a first electrode film forming process of forming a first electrode film on a substrate on which the piezoelectric actuator is to be formed, wherein the first electrode film is to be the first electrode;
   a monomolecular film forming process of forming a monomolecular film at a desired area on the first electrode film by causing molecules to be self-assembled;
   a pattering process of patterning the monomolecular film to remove a portion of the monomolecular film having the rectangular shape of the piezoelectric film and exposing a portion of the first electrode film having the rectangular shape;
   an application process of applying a precursor solution of a piezoelectric material to the portion of the first electrode film exposed in the rectangular shape, wherein the precursor solution of the piezoelectric material is to be the piezoelectric film;
   a piezoelectric film forming process of converting the applied precursor solution into the piezoelectric film; and
   a second electrode film forming process of forming a second electrode film on the formed piezoelectric film, wherein the second electrode film is to be a second electrode;
   wherein a material of the precursor solution, a material of the first electrode film, and a material of the monomolecular film are adjusted so that the first electrode film is lyophilic with respect to the precursor solution of the piezoelectric material and the monomolecular film is lyophobic with respect to the precursor solution of the piezoelectric material; and
   wherein the piezoelectric film forming process includes a drying and thermally decomposing process of drying and thermally decomposing the applied precursor solution; and a crystallizing process of crystallizing the thermally decomposed piezoelectric material.

2. The method of producing the piezoelectric actuator according to claim 1,
   wherein the substrate on which the piezoelectric actuator is to be formed is an Si substrate;
   wherein the material of the first electrode film is a platinum group element or an oxide of a platinum group element, and a material of the second electrode film is a platinum group element or an oxide of a platinum group element;
   wherein the material of the monomolecular film is an alkanethiol; and wherein the precursor solution of the piezoelectric film is a precursor solution including a metal composite oxide.

3. The method of producing the piezoelectric actuator according to claim 2,
wherein the material of the first electrode film is a platinum group metal; and
wherein the precursor solution of the piezoelectric film is a PZT precursor solution.

4. The method of producing the piezoelectric actuator according to claim 1,
wherein plural of the piezoelectric films are hierarchically laminated and formed by performing the monomolecular film forming process, the application process, and the drying and thermally decomposing process plural times and performing the crystallizing process at least once; and
wherein plural of the application processes by an inkjet method are controlled such that a length in a longitudinal direction of each one of the hierarchically laminated piezoelectric films is less than a length in the longitudinal direction of the piezoelectric film placed immediately below the one of the hierarchically laminated piezoelectric films.

5. The method of producing the piezoelectric actuator according to claim 1,
wherein the second electrode film is formed on the piezoelectric film by an inkjet method.

* * * * *